United States Patent
Hori et al.

(10) Patent No.: US 11,629,827 B2
(45) Date of Patent: Apr. 18, 2023

(54) ILLUMINATION DEVICE AND LIGHT-EMITTING MODULE

(71) Applicant: Nuvoton Technology Corporation Japan, Kyoto (JP)

(72) Inventors: Atsuhiro Hori, Toyama (JP); Kenji Nakashima, Toyama (JP); Yasutoshi Kawaguchi, Toyama (JP); Hidemi Takeishi, Toyama (JP); Masanori Michimori, Toyama (JP); Shigeo Hayashi, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/845,749

(22) Filed: Jun. 21, 2022

(65) Prior Publication Data
US 2022/0316662 A1    Oct. 6, 2022

Related U.S. Application Data

(63) Continuation of application No. PCT/JP2020/042202, filed on Nov. 12, 2020.

(30) Foreign Application Priority Data

Dec. 27, 2019 (JP) .............................. JP2019-239820

(51) Int. Cl.
*F21K 9/64* (2016.01)
*H01L 33/50* (2010.01)

(52) U.S. Cl.
CPC .............. *F21K 9/64* (2016.08); *H01L 33/504* (2013.01)

(58) Field of Classification Search
CPC .. F21S 43/14; F21S 43/00; F21S 41/13; F21S 41/125; A61L 2202/14; A61L 2/0047
See application file for complete search history.

(56) References Cited

U.S. PATENT DOCUMENTS 9,414,464 B2 *  8/2016  Hidaka ................ H05B 47/125
10,313,599 B2 *  6/2019  Fuchikami ................ G01S 5/16
(Continued)

FOREIGN PATENT DOCUMENTS

JP    2006-341713 A    12/2006
JP    2009-286198 A    12/2009
(Continued)

OTHER PUBLICATIONS

International Search Report dated Jan. 19, 2021 In International Patent Application No. PCT/JP2020/042202, with English translation.
(Continued)

*Primary Examiner* — Andrew J Coughlin
(74) *Attorney, Agent, or Firm* — McDermott Will & Emery LLP

(57) ABSTRACT

An illumination device includes a first light source that emits first light having a first peak wavelength which is highest in intensity in a wavelength range from near-ultraviolet to green in an emission spectrum; a second light source that emits second light having a second peak wavelength which is highest in intensity in a wavelength range from near-ultraviolet to green in an emission spectrum, the second light illuminating a position identical to a position illuminated by the first light; and a detection device that detects whether an object is present at a given position, wherein the second peak wavelength is shorter than the first peak wavelength, and a luminous flux of the first light is decreased and a luminous flux of the second light is increased when the detection device detects that the object is present at the predetermined position.

21 Claims, 17 Drawing Sheets

(56) References Cited

U.S. PATENT DOCUMENTS

| | | | |
|---|---|---|---|
| 2014/0016335 A1* | 1/2014 | Cho | F21S 41/663 |
| | | | 362/466 |
| 2015/0014715 A1* | 1/2015 | Hsing Chen | H01L 25/0753 |
| | | | 257/89 |
| 2015/0091447 A1* | 4/2015 | Kubo | H05B 45/22 |
| | | | 315/153 |
| 2015/0343104 A1* | 12/2015 | Maxik | G01J 1/42 |
| | | | 250/201.1 |
| 2020/0230271 A1* | 7/2020 | Choi | F21V 1/20 |
| 2021/0225814 A1 | 7/2021 | Ueno et al. | |
| 2021/0400181 A1* | 12/2021 | Taniguchi | H04N 5/2352 |
| 2022/0258665 A1* | 8/2022 | Lindberg Nilsson | B60Q 3/74 |

FOREIGN PATENT DOCUMENTS

| | | |
|---|---|---|
| JP | 2012-028272 A | 2/2012 |
| JP | 2013-109911 A | 6/2013 |
| WO | 2015/174322 A1 | 11/2015 |
| WO | 2019/087232 A1 | 5/2019 |

OTHER PUBLICATIONS

English translation of Written Opinion dated Jan. 19, 2021 in International Patent Application No. PCT/JP2020/042202.

* cited by examiner

ILLUMINATION DEVICE AND LIGHT-EMITTING MODULE

CROSS REFERENCE TO RELATED APPLICATIONS

This is a continuation application of PCT International Application No. PCT/JP2020/042202 filed on Nov. 12, 2020, designating the United States of America, which is based on and claims priority of Japanese Patent Application No. 2019-239820 filed on Dec. 27, 2019. The entire disclosures of the above-identified applications, including the specifications, drawings and claims are incorporated herein by reference in their entirety.

FIELD

The present disclosure relates to an illumination device and a light-emitting module.

BACKGROUND

There has been a demand to improve the visibility of drivers driving automobiles from the perspective of preventing traffic accidents at night. For example, the headlight illumination direction change system disclosed in Patent Literature (PTL) 1 improves the visibility of drivers. More specifically, the system determines whether an obstacle is present in image data obtained from an imaging device, and when determining that an obstacle is present, calculates the distance and direction to the obstacle. Furthermore, according to the calculated distance and direction, the system changes the direction of the optical axis of the headlights, which are an illumination device, to a direction in which the obstacle can be illuminated. As a result, the obstacle (for example, a pedestrian) is illuminated, thereby improving the visibility of the driver driving the automobile that includes the system.

CITATION LIST

Patent Literature

PTL 1: Japanese Unexamined Patent Application Publication No.

SUMMARY

Technical Problem

The system disclosed in PTL 1, however, actively illuminates an obstacle (for example, a pedestrian) using headlights, which are an illumination device. Therefore, the pedestrian perceives the light from the headlights (the illumination device) of the automobile including the system, as glaring.

In view of the above, the present disclosure has an object to provide an illumination device and the like that emit light that is less glaring to pedestrians, for example.

Solution to Problem

An illumination device according to an aspect of the present disclosure includes: a first light source that emits first light having a first peak wavelength which is highest in intensity in a wavelength range from near-ultraviolet to green in an emission spectrum; a second light source that emits second light having a second peak wavelength which is highest in intensity in a wavelength range from near-ultraviolet to green in an emission spectrum, the second light illuminating a position identical to a position illuminated by the first light; and a detection device that detects whether an object is present at a given position, wherein the second peak wavelength is shorter than the first peak wavelength, and a luminous flux of the first light is decreased and a luminous flux of the second light is increased when the detection device detects that the object is present at the position.

A light-emitting module according to an aspect of the present disclosure includes: a first white light source including a first excitation source and a first wavelength conversion component, the first excitation source emitting light having a first peak wavelength in a wavelength range from near-ultraviolet to green in an emission spectrum, the first wavelength conversion component converting the light emitted from the first excitation source; a second white light source that includes a second excitation source and a second wavelength conversion component, and emits light which illuminates a position identical to a position illuminated by light emitted from the first white light source, the second excitation source emitting light having a second peak wavelength shorter than the first peak wavelength in a wavelength range from near-ultraviolet to green in an emission spectrum, the second wavelength conversion component converting the light emitted from the second excitation source; a substrate on which the first white light source and the second white light source are mounted; and a structure body for independently controlling an ON state of each of the first white light source and the second white light source.

Advantageous Effects

According to the present disclosure, it is possible to provide an illumination device and the like that emit light that is less glaring to pedestrians, for example.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, an illumination device according to some exemplary embodiments will be described with reference to the accompanying drawings. Note that the embodiments described below each illustrate a general or specific example. The numerical values, shapes, materials, constituent elements, the arrangement and connection of the constituent elements, etc, illustrated in the embodiments below are mere examples, and do not intend to limit the present disclosure.

In the embodiments described below, the terms "above" and "below" do not refer to the upward direction (vertically above) or the downward direction (vertically below) in the sense of absolute space recognition. In addition, the terms "above" and "below" are applied not only when two constituent elements are disposed apart from each other and there is another constituent element between the two constituent elements, but also when two constituent elements are disposed in contact with each other.

In this Specification, the numeric ranges do not represent the strict meaning only, but also include a substantially equivalent range, for example a difference of several percentages.

Embodiment 1

[Configuration]

First, a configuration of illumination device 100 according to Embodiment 1 will be described with reference to the drawings.

Figure 1:
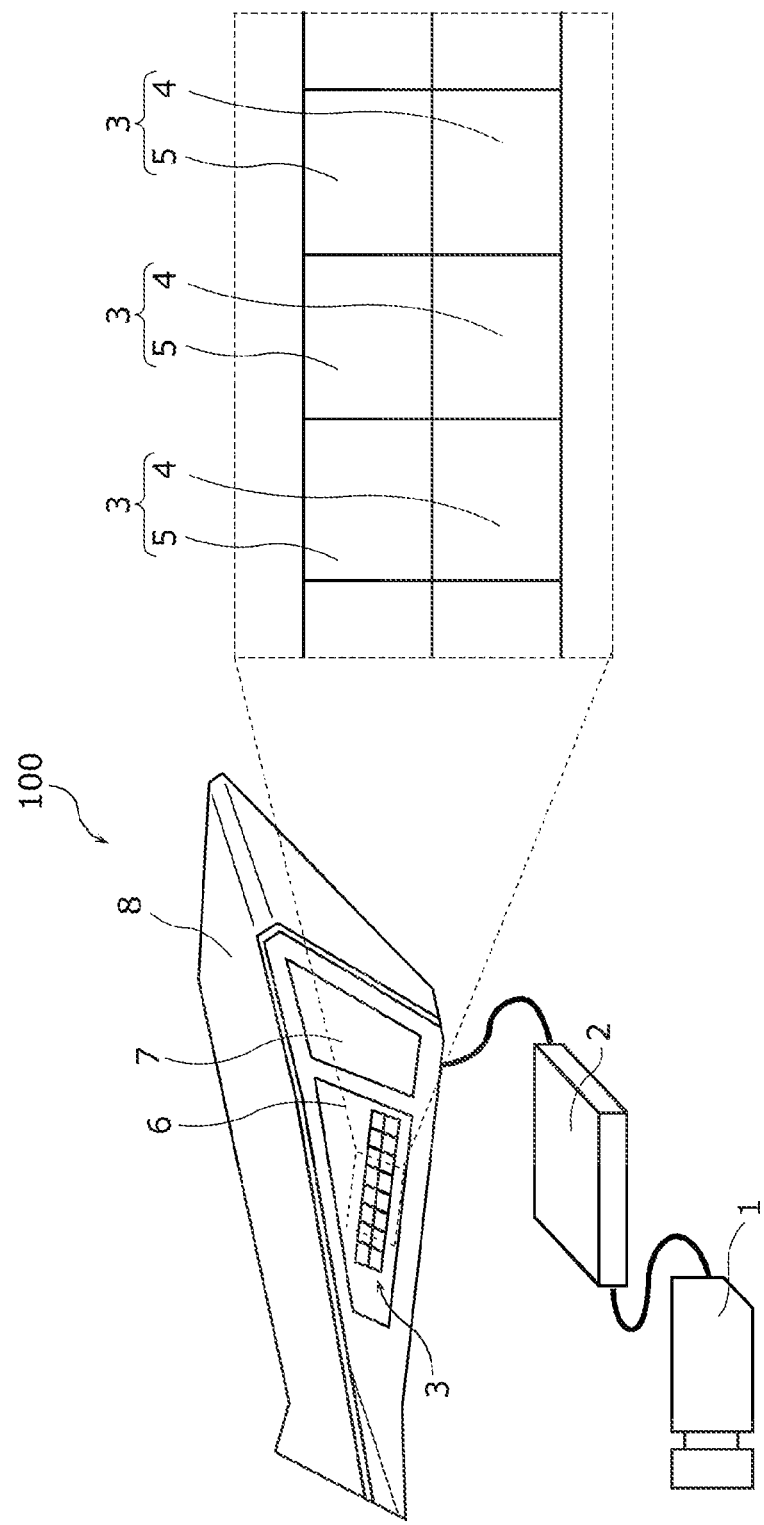
FIG. 1 is a perspective diagram illustrating a usage example of an illumination device according to Embodiment 1.

FIG. 1 is a perspective diagram illustrating a usage example of illumination device 100 according to the present embodiment. The area enclosed by a dashed-lined rectangle in FIG. 1 is an enlarged view of a portion of illumination device 100, illustrating lamp bodies 3 provided in illumination device 100.

As illustrated in FIG. 1, illumination device 100 is used as, for example, headlights that illuminate a region in front of an automobile. In this case, illumination device 100 illuminates the region in front of the automobile at night to brightly illuminate, for example, a pedestrian, a bicyclist, or an automobile other than the automobile that includes illumination device 100. Illumination device 100 may illuminate the region in front of the automobile at night to brightly illuminate, for example, a sign, a guardrail, a roadside tree, or an animal.

Illumination device 100 according to the present embodiment includes lamp body unit 8, detection device 1, and control device 2.

Lamp body unit 8 includes high beam unit 6 and low beam unit 7. High beam unit 6 is a headlamp used for driving, and emits light that illuminates a region far from the front of the automobile that uses illumination device 100 as headlights (hereinafter referred to as an automobile including illumination device 100). Low beam unit 7 is a headlamp used for passing oncoming cars, and emits light that illuminates a region in the vicinity of the front of the automobile including illumination device 100.

High beam unit 6 includes lamp bodies 3. Each lamp body 3 includes first light source 4 that emits first light and second light source 5 that emits second light. Note that each lamp body 3 may include first optical component 45 and second optical component 55, as will be described in detail later. Light emitted by each lamp body 3 is combined light of the first light and the second light.

Figure 2:
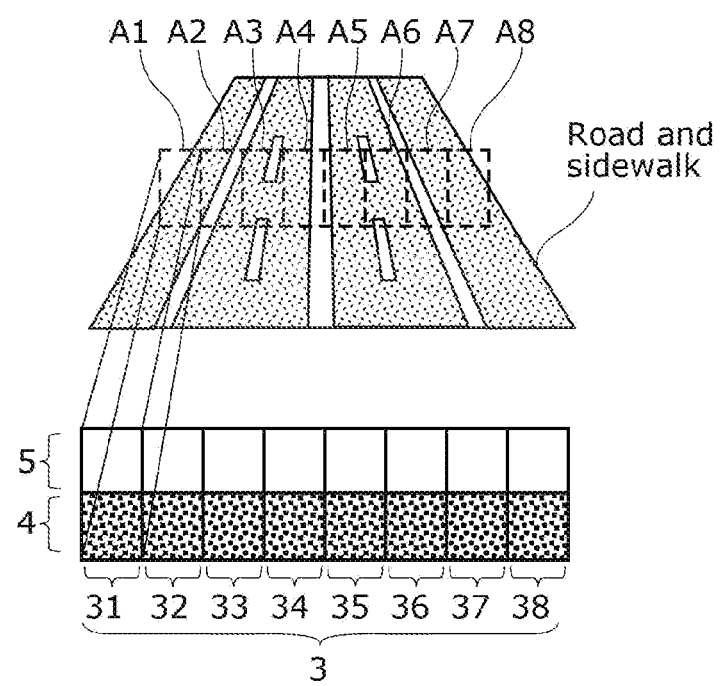
FIG. 2 is a conceptual diagram illustrating positions illuminated by first light and second light according to Embodiment 1.

The second light emitted by second light source 5 illuminates a position identical to the position illuminated by the first light emitted by first light source 4. This will be more specifically described with reference to FIG. 2. FIG. 2 is a conceptual diagram illustrating positions illuminated by the first light and the second light according to the present embodiment.

As illustrated in FIG. 1 and FIG. 2, in the present embodiment, high beam unit 6 includes a plurality of lamp bodies 3. Specifically, high beam unit 6 includes eight lamp bodies 3. For the sake of explanation, eight lamp bodies 3 are referred to as lamp bodies 31 to 38. In high beam unit 6, each lamp body 3 includes first light source 4 and second light source 5. In other words, in the present embodiment, a plurality of first light sources 4 and a plurality of second light sources 5 are provided. In this case, the light (i.e., the first light) emitted by first light source 4 included in one of lamp bodies 3 and the light (i.e., the second light) emitted by second light source 5 included in the same one of lamp bodies 3 illuminate an identical position.

For example, the first light and the second light emitted from first light source 4 and second light source 5 included in lamp body 31 illuminate identical position A1 on the road and sidewalk. Similarly, in lamp bodies 32 to 38, the first light and the second light illuminate identical positions A2 to A8 on the road and sidewalk.

The term "identical" in "identical position" is not limited to the meaning that the position illuminated by the first light and the position illuminated by the second light overlap completely. The term "identical" in "identical position" may mean, for example, that the position illuminated by the first light and the position illuminated by the second light overlap partially.

Detection device 1 is a device that detects whether an object is present at a given position. More specifically, the given position is, for example, the position illuminated by the first light and the second light emitted by first light source 4 and second light source 5 included in one lamp body 3 (i.e., positions A1 to A8). An object is a person located on the road and sidewalk, and is, for example, a pedestrian or a bicyclist. An object is also, for example, a driver of an automobile (e.g., an oncoming car) other than the automobile including illumination device 100. Detection device 1 outputs the detection result to control device 2 as a signal.

Detection device 1 may be any kind of device, so long as it can detect whether an object is present at a given position. For example, detection device 1 is a camera having a complementary metal oxide semiconductor (CMOS) image sensor.

Control device 2 is a device connected to detection device 1 and lamp bodies 3 (first light sources 4 and second light sources 5). Control device 2 controls the light emission of first light sources 4 and second light sources 5 based on the detection result (signal) of detection device 1. Control device 2 may control the light emission of first light sources 4 and second light sources 5 by controlling the amount of power supplied to first light sources 4 and second light sources 5. For example, control device 2 decreases the luminous flux of the first light and increases the luminous flux of the second light when detection device 1 detects that an object is present at the above given position.

Control device 2 may be, for example, a device including a central processing unit (CPU), memory, and a program.

Detection device 1 and control device 2 may be housed in a single case. That is to say, detection device 1 and control device 2 may be formed as an integral unit.

Figure 3A:
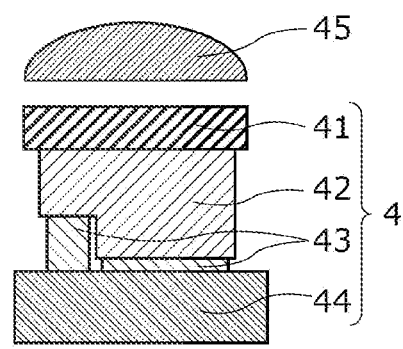
FIG. 3A is a cross-sectional view of a first light source included in the illumination device according to Embodiment 1.
Figure 3B:
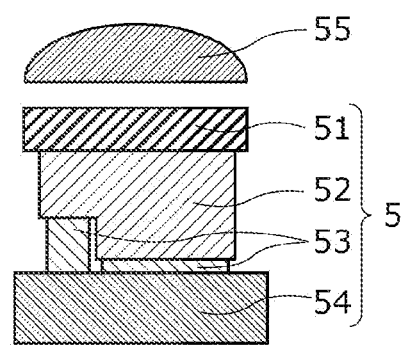
FIG. 3B is a cross-sectional view of a second light source included in the illumination device according to Embodiment 1.

A detailed structure of lamp body 3 is illustrated in FIG. 3A and FIG. 3B. FIG. 3A is a cross-sectional view of first light source 4 included in illumination device 100 according to the present embodiment. FIG. 3B is a cross-sectional view of second light source 5 included in illumination device 100 according to the present embodiment.

First light source 4 includes substrate 44, bumps 43, light-emitting element 42, and wavelength conversion layer 41. Also, first optical component 45 may be provided in the direction in which first light source 4 emits the first light.

Substrate 44 is a substrate for mounting light-emitting element 42, and includes metal wiring for supplying power to light-emitting element 42 (more specifically, bumps 43). Bumps 43 are connected to light-emitting element 42 and the metal wiring included in substrate 44, and allows supply of power to light-emitting element 42 from the metal wiring.

Light-emitting element 42 is, for example, a light-emitting body such as a light-emitting diode (LED). Light-emitting element 42 is an LED that emits light in the wavelength range from near-ultraviolet to green. More specifically, light-emitting element 42 is an LED chip. Note that, other than an LED, a laser diode can also be used as light-emitting element 42. The wavelength range from near-ultraviolet to green is, for example, the wavelength range from at least 380 nm to at most 550 nm.

Wavelength conversion layer 41 is a layer that converts light emitted from light-emitting element 42 into light of a different wavelength. Wavelength conversion layer 41 may be, for example, a plate-shaped component. Wavelength conversion layer 41 is formed using, for example, a light-transmissive resin material, glass, or ceramics containing yellow phosphor particles as a wavelength conversion material. For example, a silicone resin is used as the light-transmissive resin material, but an epoxy resin, a urea resin, or the like may be used. For example, yttrium aluminum garnet (YAG) phosphor particles are used as the yellow phosphor particles.

With this configuration, a portion of the light emitted by light-emitting element 42 is wavelength-converted into yellow light by the yellow phosphor particles contained in wavelength conversion layer 41. Light emitted by light-emitting element 42 and not absorbed by the yellow phosphor particles and the yellow light resulting from the wavelength conversion by the yellow phosphor particles are diffused and mixed in wavelength conversion layer 41. As a result, white light is emitted from wavelength conversion layer 41.

First optical component 45 is a component that guides or condenses the first light emitted from first light source 4. First optical component 45 is, for example, a convex lens that condenses the first light. First optical component 45 is disposed opposite wavelength conversion layer 41. Providing first optical component 45 allows the first light to be emitted toward a given position. For example, in the present embodiment, the first light is emitted toward positions A1 to A8.

Second light source 5 includes substrate 54, bumps 53, light-emitting element 52, and wavelength conversion layer 51. Also, second optical component 55 may be provided in the direction in which second light source 5 emits the second light.

Substrate 54 is a substrate for mounting light-emitting element 52, and includes metal wiring for supplying power to light-emitting element 52 (more specifically, bumps 53). Bumps 53 are connected to light-emitting element 52 and the metal wiring included in substrate 54, and allows supply of power to light-emitting element 52 from the metal wiring.

Light-emitting element 52 is, for example, a light-emitting body such as an LED. Light-emitting element 52 is an LED that emits light in the wavelength range from near-ultraviolet to green. More specifically, light-emitting element 52 is an LED chip. Note that, other than an LED, a laser diode can also be used as light-emitting element 52.

Wavelength conversion layer 51 is a layer that converts light emitted from light-emitting element 52 into light of a different wavelength. Wavelength conversion layer 51 may be formed using the same component as that of wavelength conversion layer 41.

With this configuration, white light is emitted from wavelength conversion layer 51.

Second optical component 55 is a component that guides or condenses the second light emitted from second light source 5, Second optical component 55 is, for example, a convex lens that condenses the second light. Second optical component 55 is disposed opposite wavelength conversion layer 51. Providing second optical component 55 allows the second light to be emitted toward a given position. For example, in the present embodiment, the second light is emitted toward positions A1 to A8.

First light source 4 and second light source 5 in the present embodiment are surface mount device (SMD)-type LED elements. First and second light sources 4 and 5, however, may be chip on board (CM-type LED elements.

In the present embodiment, one light-emitting element 42 is provided above one substrate 44, but the present disclosure is not limited to this. For example, a plurality of light-emitting elements 42 may be provided above one substrate 44. Likewise, a plurality of light-emitting elements 52 may be provided above one substrate 54. Also, although first light source 4 and second light source 5 include the same number of light-emitting elements (i.e., first light source 4 includes one light-emitting element 42 and second light source 5 includes one light-emitting element 52), the present disclosure is not limited to this.

First light source 4 and second light source 5 may be sealed by a sealing material. A resin material can be used as the sealing material. The resin material may be, but not limited to, for example, a transparent resin material used for forming wavelength conversion layer 41 and wavelength conversion layer 51.

Substrate 44 and substrate 54 may form a common substrate. Specifically, light-emitting element 42 and light-emitting element 52 may be provided above substrate 44.

The following describes behaviors of the first light emitted by first light source 4 and the second light emitted by second light source 5.

First light source 4 emits first light having a first peak wavelength ($\lambda_1$) which is highest in intensity in the wavelength range from near-ultraviolet to green in the emission spectrum. Second light source 5 emits second light having a second peak wavelength ($\lambda_2$) which is highest in intensity in the wavelength range from near-ultraviolet to green in the emission spectrum. The second peak wavelength is shorter than the first peak wavelength. The first light and the second light will be described with reference to FIG. 4A and FIG. 4B.

Figure 4A:
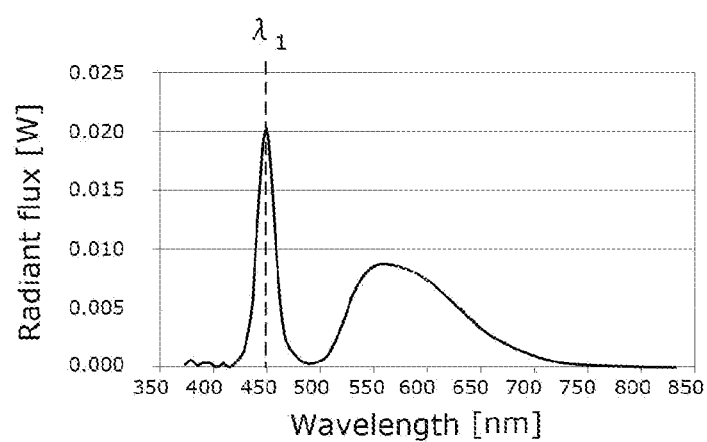
FIG. 4A is a graph illustrating a radiant flux spectrum of the first light according to Embodiment 1.
Figure 4B:
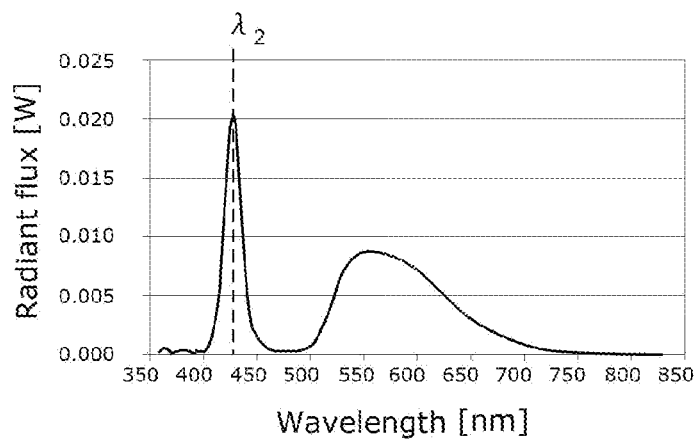
FIG. 4B is a graph illustrating a radiant flux spectrum of the second light according to Embodiment 1.

FIG. 4A is a graph illustrating a radiant flux spectrum of the first light according to the present embodiment. FIG. 4B is a graph illustrating a radiant flux spectrum of the second light according to the present embodiment.

As illustrated in FIG. 4A and FIG. 4B, the first light and the second light respectively have the first peak wavelength and the second peak wavelength which are highest in intensity in the wavelength range from near-ultraviolet to green. For example, the first peak wavelength is 450 nm and the second peak wavelength is 430 nm.

The light in the wavelength range centered on the first peak wavelength and the light in the wavelength range centered on the second peak wavelength respectively correspond to the light emitted by light-emitting element 42 and the light emitted by light-emitting element 52 described above, and are commonly known as excitation light. The light in the range from at least 500 nm to at most 750 nm illustrated in FIG. 4A and FIG. 4B is light resulting from wavelength conversion performed on the excitation light by wavelength conversion layer 41 and wavelength conversion layer 51.

Note that the integral of the radiant flux of the first light in the full wavelength range may be the same as the integral of the radiant flux of the second light in the full wavelength range.

As illustrated in FIG. 4A and FIG. 4B, the peak wavelength of light that is included in the first light and is obtained through the wavelength conversion (light in the range from at least 500 nm to at most 750 nm) and the peak wavelength of light that is included in the second light and is obtained through the wavelength conversion (light in the range from at least 500 nm to at most 750 nm) may be the same.

Here, attention is given to the photopic spectral luminous efficacy and the scotopic spectral luminous efficacy of the first light and the second light.

A spectral luminous efficacy is a measure of the degree of intensity at which human vision perceives light, and has a value dependent on the wavelength of light.

Depending on the brightness in a person's field of view, either the photopic spectral luminous efficacy or the scotopic spectral luminous efficacy is used. Specifically, when the luminance in a person's field of view is at least 1 cd/m$^2$ (i.e., in the case of photopic vision), the photopic spectral luminous efficacy is used, and among a person's visual cells, cone cells are mainly at work. On the other hand, when the luminance in a person's field of view is at most 10$^{-2}$ cd/m$^2$ (i.e., in the case of scotopic vision), the scotopic spectral luminous efficacy is used, and among a person's visual cells, rod cells are mainly at work.

Therefore, in the present embodiment, drivers of automobiles use the photopic spectral luminous efficacy at night. Drivers of automobiles include a driver of an automobile including illumination device 100 and a driver of an automobile other than the automobile including illumination device 100. On the other hand, pedestrians and bicyclists illuminated by illumination device 100 use the scotopic spectral luminous efficacy at night.

Based on the above, the following describes the results of calculation of the luminous flux and luminance of the first light and the second light emitted by first light source 4 and second light source 5 in photopic vision and scotopic vision, using the photopic spectral luminous efficacy and the scotopic spectral luminous efficacy.

Figure 5:
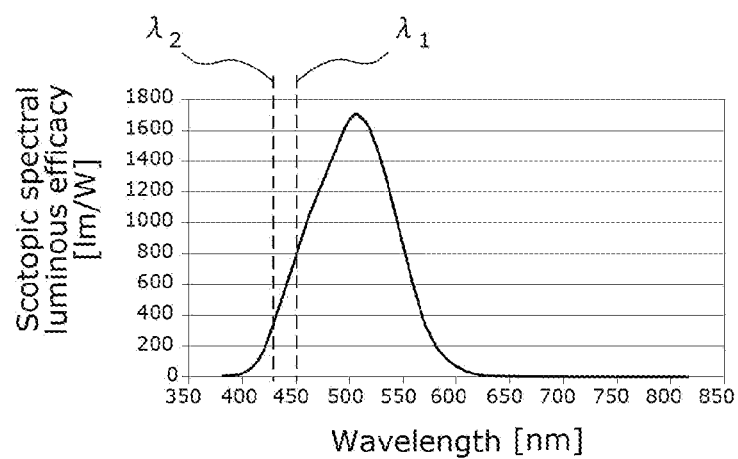
FIG. 5 is a graph illustrating scotopic spectral luminous efficacy.
Figure 6A:
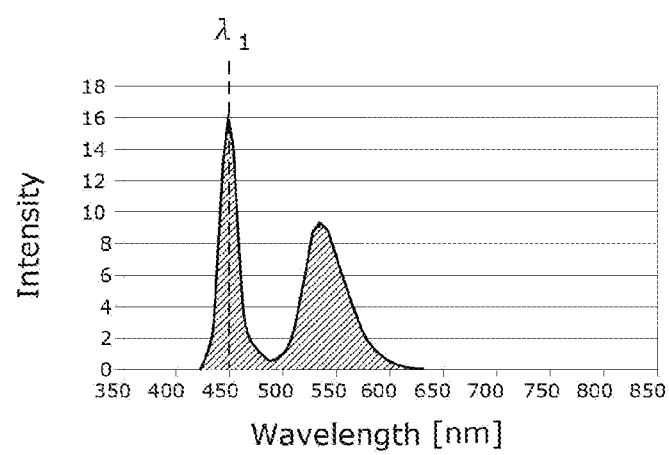
FIG. 6A is a graph illustrating a luminous flux spectrum of the first light in scotopic vision according to Embodiment 1.
Figure 6B:
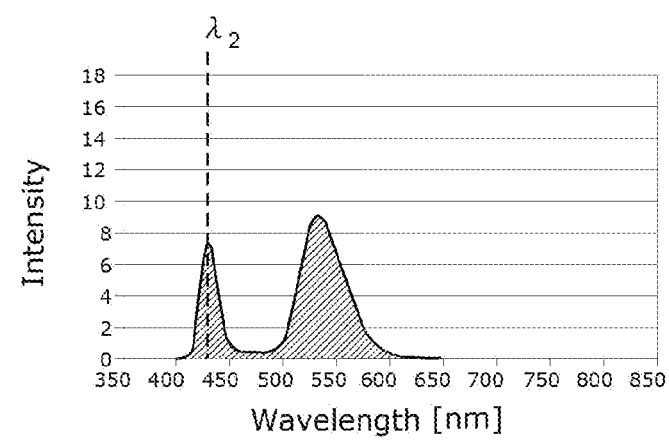
FIG. 6B is a graph illustrating a luminous flux spectrum of second light in scotopic vision according to Embodiment 1.

FIG. 5 is a graph illustrating scotopic spectral luminous efficacy. FIG. 6A is a graph illustrating a luminous flux spectrum of the first light in scotopic vision according to the present embodiment. FIG. 6B is a graph illustrating a luminous flux spectrum of the second light in scotopic vision according to the present embodiment. Note that in FIG. 5, the first peak wavelength and the second peak wavelength are represented by dashed lines.

As illustrated in FIG. 5, the function indicating the scotopic spectral luminous efficacy has a peak wavelength at 507 nm. The luminous flux spectra of the first light and the second light in scotopic vision are calculated by multiplying, for each wavelength, the radiant flux spectra of the first light and the second light illustrated in FIG. 4A and FIG. 4B by a function indicating the scotopic spectral luminous efficacy. Note that the value of the luminous flux is calculated by integrating the intensity of a luminous flux spectrum with respect to the full wavelength range.

As illustrated in FIG. 6A and FIG. 6B, although the luminous flux spectra in the scotopic vision have the same peak at 530 nm, the intensity of light in the wavelength range centered on the second peak wavelength is lower than the intensity of light in the wavelength range centered on the first peak wavelength.

Furthermore, the luminances of the first light and the second light are calculated from the luminous flux spectra. Luminance is calculated by dividing luminous flux by area size and solid angle of radiation. Luminance increases with an increase in luminous flux. When the scotopic luminance of the first light calculated from FIG. 6A was assumed 100%, the scotopic luminance of the second light calculated from FIG. 6B was 73.9%.

In other words, as compared to the first light emitted by first light source 4, the second light emitted by second light source 5 has a low scotopic luminance, which means, the second light is less glaring to pedestrians.

Figure 7:
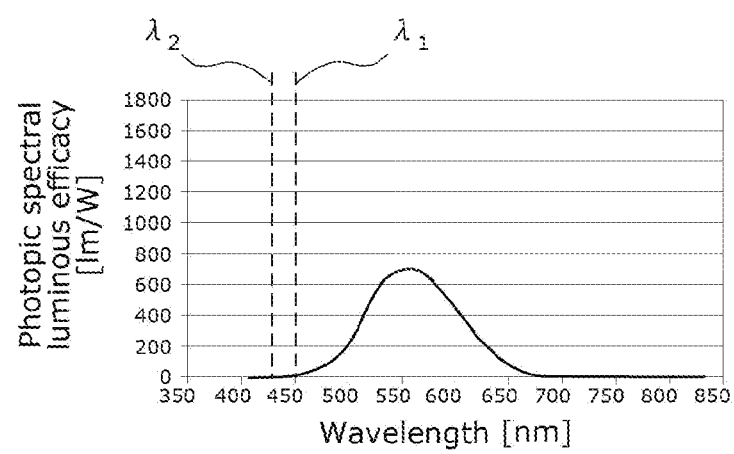
FIG. 7 is a graph illustrating photopic spectral luminous efficacy.
Figure 8A:
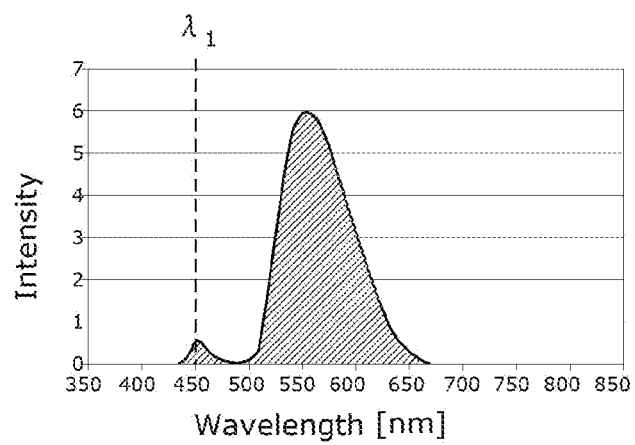
FIG. 8A is a graph illustrating a luminous flux spectrum of the first light in photopic vision according to Embodiment 1.
Figure 8B:
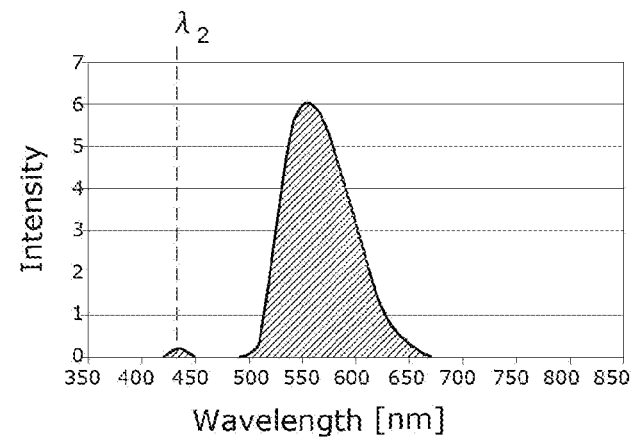
FIG. 8B is a graph illustrating a luminous flux spectrum of the second light in photopic vision according to Embodiment 1.

FIG. 7 is a graph illustrating photopic spectral luminous efficacy. FIG. 8A is a graph illustrating a luminous flux spectrum of the first light in photopic vision according to the present embodiment. FIG. 8B is a graph illustrating a luminous flux spectrum of the second light in photopic vision according to the present embodiment. Note that in FIG. 7, the first peak wavelength and the second peak wavelength are represented by dashed lines.

As illustrated in FIG. 7, the function indicating the photopic spectral luminous efficacy has a peak wavelength at 555 nm. The luminous flux spectra of the first light and the second light in photopic vision are calculated by multiplying, for each wavelength, the radiant flux spectra of the first light and the second light illustrated in FIG. 4A and FIG. 4B by a function indicating the photopic spectral luminous efficacy.

Furthermore, the illuminances of the first light and the second light are calculated from the luminous flux spectra. Illuminance is calculated by dividing luminous flux by area size illuminated. Illuminance increases with an increase in the luminous flux. When the photopic illuminance of the first light calculated from FIG. 8A was assumed 100%, the photopic illuminance of the second light calculated from FIG. 8B was 98.4%. Likewise, when the photopic luminance of the first light calculated from FIG. 8A was assumed 100%, the photopic luminance of the second light calculated from FIG. 8B was 98.4%.

That is to say, in the photopic vision, the second light emitted by second light source 5 has an illuminance that is slightly lower than, but is comparable to, the illuminance of the first light emitted by first light source 4.

Therefore, in both the case where the first light emitted by first light source 4 illuminates the front region and the case where the second light emitted by second light source 5 illuminates the front region, the driver of the automobile including illumination device 100 as the headlights is less likely to perceive the front region as dark, and visibility is ensured.

The following specifically describes an illumination method that uses the principle described above.

[Processing Procedure of Illumination Device]

A specific processing procedure of an illumination method performed by illumination device 100 will be described with reference to FIG. 9 through FIG. 10B.

Figure 9:
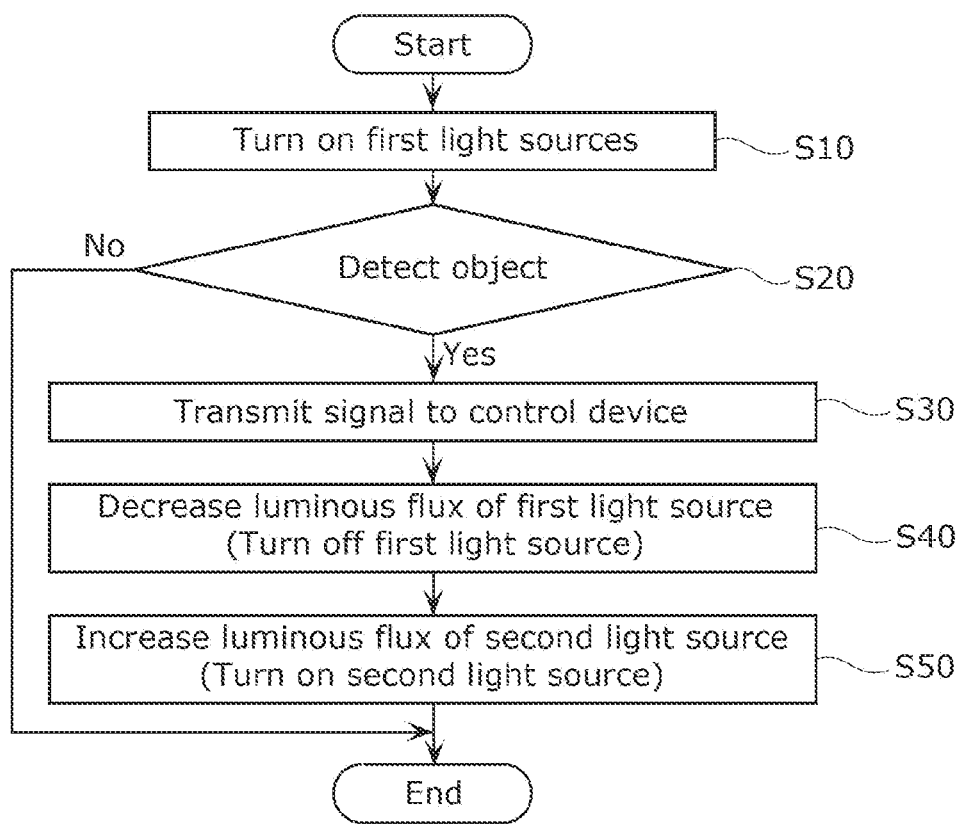
FIG. 9 is a flowchart illustrating a processing procedure of illumination performed by the illumination device according to Embodiment 1.
Figure 10A:
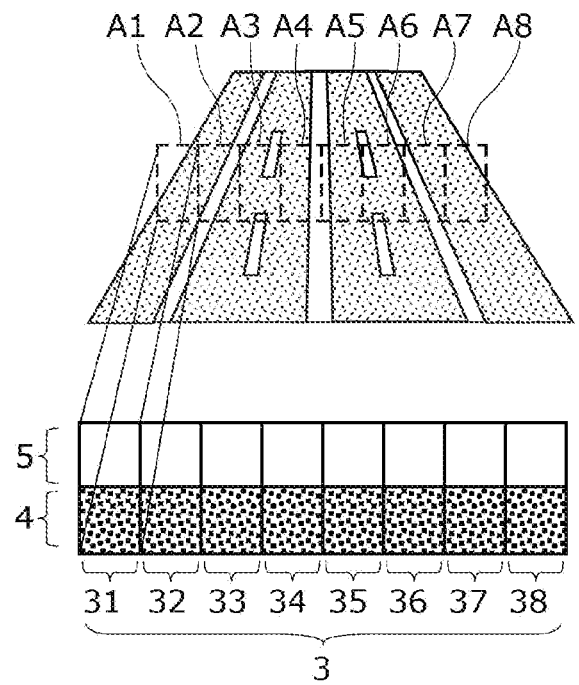
FIG. 10A is a diagram illustrating a state in which first light sources of the illumination device according to Embodiment 1 emit the first light.

FIG. 9 is a flowchart illustrating a processing procedure of illumination performed by illumination device 100 according to the present embodiment. FIG. 10A is a diagram illustrating a state in which first light sources 4 of illumination device 100 according to the present embodiment emit the first light. FIG. 10B is a diagram illustrating a state in which first light sources 4 and second light sources 5 of illumination device 100 according to the present embodiment emit the first light and the second light, respectively. Note that, in FIG. 10A and FIG. 10B, a plurality of lamp bodies 3 are provided and each lamp body 3 is a different one of lamp bodies 31 to 38 as in FIG. 2. Of first light sources 4 and second light sources 5, light sources that emit light are marked with dots.

First, first light sources 4 are turned on (step S10). Specifically, control device 2 turns on first light sources 4 by controlling the amount of power supplied to first light sources 4. In other words, first light sources 4 emit the first light. At night, step S10 may be performed when control device 2 receives an instruction to turn on high beam unit 6 from the driver driving the automobile including illumination device 100.

For example, in step S10, illumination device 100 is in an illumination state as illustrated in FIG. 10A. Specifically, only first light sources 4 emit light (the first light) and second light sources 5 do not emit light (the second light). The first light emitted from first light sources 4 included in lamp bodies 31 to 38 illuminate positions A1 to A8.

Furthermore, detection device 1 detects whether an object is present at a position illuminated by the first light and the second light (step S20). More specifically, detection device 1 detects whether an object is present at positions A1 to A8.

When detection device 1 detects that an object is present (Yes in step S20), detection device 1 outputs a detection result (signal) to control device 2 (step S30). For example, the detection result (signal) may include information indicating the position, among positions A1 to A8, at which the object is present.

Furthermore, control device 2 decreases the luminous flux of the first light by controlling the amount of power supplied to first light sources 4, based on the detection result (signal) of detection device 1 (step S40). More specifically, control device 2 decreases the luminous flux of the first light by controlling first light source 4 emitting the first light illuminating the position of the object, based on the information indicating the position of the object. For example, control device 2 may turn off first light source 4. That is to say, first light source 4 may change from the ON state to the OFF state when detection device 1 detects that an object is present.

Subsequently, control device 2 increases the luminous flux of the second light by controlling the amount of power supplied to second light sources 5, based on the detection result (signal) of detection device 1 (step S50). More specifically, control device 2 increases the luminous flux of the second light by controlling second light source 5 that emits the second light to illuminate the position of the object, based on the information indicating the position of the object. For example, control device 2 may turn on second light source 5. That is to say, second light source 5 may change from the OFF state to the ON state when detection device 1 detects that an object is present.

When steps S40 and S50 are performed, the light emitted by lamp bodies 3 may be such light as described below. For example, the scotopic luminance of light emitted by lamp bodies 3 when the detection device detects that an object is present may be lower than the scotopic luminance of light emitted by lamp bodies 3 when the detection device does not detect that an object is present. Specifically, the light emitted by lamp bodies 3 when no object is detected may be light emitted by first light sources 4 as illustrated in FIG. 10A. The light emitted by lamp bodies 3 when an object is detected may be light emitted by first light sources 4 and second light sources 5 as illustrated in FIG. 10B.

After increasing the luminous flux of the second light in step S50 in such a manner, the processing is finished. The processing is finished also when detection device 1 does not detect that an object is present (No in step S20).

Note that step S40 and step S50 may be performed simultaneously. Also, the processing order of step S40 and step S50 may be interchanged. In addition, the processing from step S20 onward may be repeated.

Figure 10B:
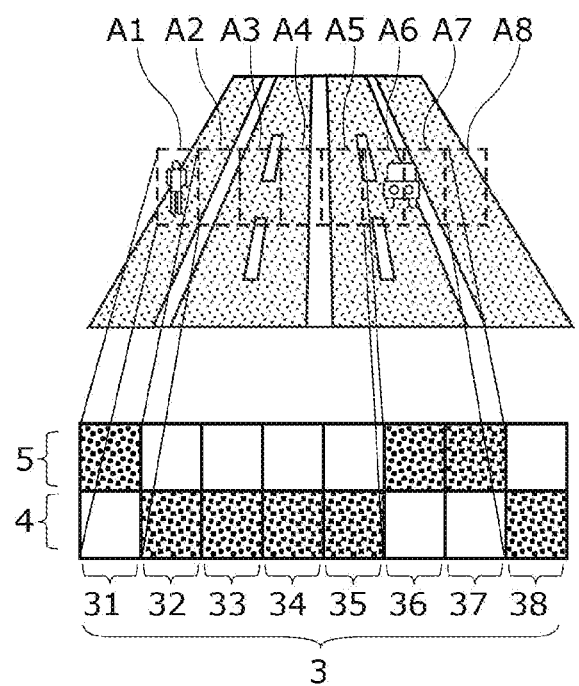
FIG. 10B is a diagram illustrating a state in which first light sources and second light sources of the illumination device according to Embodiment 1 emit the first light and the second light, respectively.

Performing steps S30, S40 and S50 puts illumination device 100 in an illumination state as illustrated in FIG. 10B.

FIG. 10B illustrates the case where detection device 1 has detected a pedestrian at position A1 and an oncoming car at positions A6 and A7 in step S30.

As illustrated in FIG. 10A, in step S10, the first light emitted by first light sources 4 included in lamp bodies 31, 36, and 37 illuminates positions A1, A6, and A7 at which objects are present. Next, as illustrated in FIG. 10B, in step S40, control device 2 turns off first light sources 4 included in lamp bodies 31, 36, and 37. Furthermore, in step S50, control device 2 turns on second light sources 5 included in lamp bodies 31, 36, and 37.

In summary, control device 2 decreases the luminous flux of the first light and increases the luminous flux of the second light when detection device 1 detects that an object is present.

By doing so, the first light is decreased and the second light is increased. As described above, in scotopic vision, the luminance of the second light is lower than the luminance of the first light. Thus, the decrease in the first light and the increase in the second light lead to an increase in the proportion of light (the second light) that is less glaring to pedestrians, Therefore, illumination device 100 which emits light that is less glaring to pedestrians is realized.

Furthermore, since the luminance of the second light is slightly lower than the luminance of the first light in photopic vision, the decrease in the first light and the increase in the second light lead to an increase in the proportion of light (the second light) that is slightly less glaring to drivers of automobiles other than the automobile including illumination device 100. Therefore, illumination device 100 which emits light that is less glaring to drivers of automobiles other than the automobile including illumination device 100 is realized.

Meanwhile, although the illuminance of the second light is slightly lower than the illuminance of the first light in photopic vision, they are comparable. Therefore, even when the first light decreases and the second light increases, the driver of the automobile including illumination device 100 is less likely to perceive the front region illuminated by illumination device 100 as dark. In other words, the driver can ensure sufficient forward visibility.

That is to say, illumination device 100 is realized which emits light that is less glaring to an object (e.g., a pedestrian) and that allows sufficient forward visibility for the driver of the automobile including illumination device 100.

The scotopic luminance of light emitted by lamp bodies 3 when the detection device detects that an object is present may be lower than the scotopic luminance of light emitted by lamp bodies 3 when the detection device does not detect that an object is present.

With this, light having a low scotopic luminance is emitted from lamp bodies 3 of illumination device 100 to illuminate the object. Specifically, the light emitted by lamp bodies 3 may have a large proportion of the second light. Thus, when the object is, for example, a pedestrian, the light emitted by lamp bodies 3 is light that is less glaring to the pedestrian.

Furthermore, first light source 4 may change from the ON state to the OFF state and second light source 5 may change from the OFF state to the ON state when detection device 1 detects that an object is present.

With this, the object is illuminated only by the second light whose scotopic luminance is lower than that of the first light. Thus, when the object is, for example, a pedestrian, the light emitted from illumination device 100 is light that is less glaring to the pedestrian.

[Advantageous Effects etc.]

As described above, illumination device 100 according to the present embodiment includes first light source 4, second light source 5, and detection device 1. The second peak wavelength of the second light emitted by second light source 5 is shorter than the first peak wavelength of the first light emitted by first light source 4. Furthermore, illumination device 100 decreases the luminous flux of the first light and increases the luminous flux of the second light when detection device 1 detects that an object is present at a position illuminated by the first light and the second light.

By doing so, the first light is decreased and the second light is increased. This leads to an increase in the proportion of light (the second light) that is less glaring to pedestrians. Therefore, illumination device 100 which emits light that is less glaring to pedestrians is realized.

Illumination device 100 according to the present embodiment includes lamp bodies 3 each including first light source 4, first optical component 45, second light source 5, and second optical component 55. The scotopic luminance of light emitted by lamp bodies 3 when the detection device detects that an object is present is lower than the scotopic luminance of light emitted by lamp bodies 3 when the detection device does not detect that an object is present.

With this, light having a low scotopic luminance is emitted from lamp bodies 3 of illumination device 100 to illuminate the object. Thus, the light emitted by lamp bodies 3 is light that is less glaring to pedestrians. Therefore, illumination device 100 which emits light that is further less glaring to pedestrians is realized.

With illumination device 100 according to the present embodiment, first light source 4 changes from the ON state to the OFF state and second light source 5 changes from the OFF state to the ON state when detection device 1 detects that an object is present.

With this, the object is illuminated only by the second light whose scotopic luminance is lower than that of the first light. Thus, the light emitted from illumination device 100 is light that is less glaring to pedestrians. Therefore, illumination device 100 which emits light that is further less glaring to pedestrians is realized.

Variations of Embodiment 1

In Embodiment 1, each of the first peak wavelength and the second peak wavelength is in the wavelength range from near-ultraviolet to green, but is not limited to this wavelength range. According to Variations 1 to 3 of Embodiment 1 described below, the first peak wavelength and the second peak wavelength may be in a wavelength range different from the wavelength range according to Embodiment 1.

Note that Variations 1 to 3 of Embodiment 1 omit detailed descriptions of constituent elements that are common to Embodiment 1.

The illumination devices according to Variations 1 to 3 of Embodiment 1 are the same in configuration as illumination device 100 according to Embodiment 1, except that the first peak wavelength and the second peak wavelength are in a wavelength range different from the wavelength range according to Embodiment 1. That is to say, illumination devices 100 according to Variations 1 to 3 of Embodiment 1 each include a lamp body unit, a detection device, and a control device. The lamp body unit includes a high beam unit and a low beam unit. The high beam unit includes lamp bodies. Each lamp body includes a first light source that emits first light and a second light source that emits second light.

The following describes Variations 1 to 3 of Embodiment 1.

Variation 1 of Embodiment 1

According to the present variation, both the first peak wavelength of the first light and the second peak wavelength of the second light may be at least 413 nm and at most 505 nm.

Assume that $F_1$ denotes the peak intensity of the first peak wavelength (hereinafter referred to as a first peak intensity), $\lambda_1$ denotes the first peak wavelength, $F_2$ denotes the peak intensity of the second peak wavelength (hereinafter referred to as a second peak intensity), and $\lambda_2$ denotes the second peak wavelength. First peak intensity $F_1$, first peak wavelength $\lambda_1$, second peak intensity $F_2$, and second peak wavelength $\lambda_2$ are illustrated in FIG. 11A and FIG. 11B.

Figure 11A:
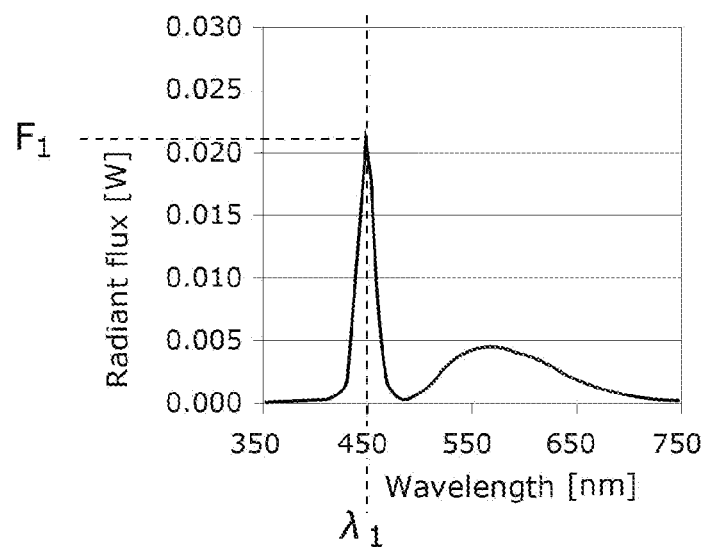
FIG. 11A is a graph illustrating a radiant flux spectrum of the first light according to Variation 1 of Embodiment 1.
Figure 11B:
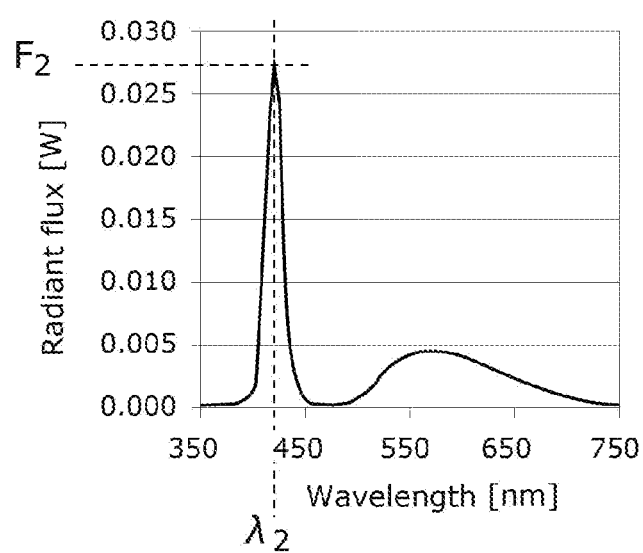
FIG. 11B is a graph illustrating a radiant flux spectrum of the second light according to Variation 1 of Embodiment 1.

FIG. 11A is a graph illustrating a radiant flux spectrum of the first light according to Variation 1 of Embodiment 1. FIG. 11B is a graph illustrating a radiant flux spectrum of the second light according to Variation 1 of Embodiment 1.

Specifically, first peak wavelength $\lambda_1$ is 450 nm and second peak wavelength $\lambda_2$ is 430 nm.

Furthermore, in the present variation, the full width at half maximum of light in the wavelength range centered on first peak wavelength $\lambda_1$ (at least 420 nm and at most 480 nm) and the full width at half maximum of light in the wavelength range centered on second peak wavelength $\lambda_2$ (at least 400 nm and at most 460 nm) are approximately the same. For example, the full width at half maximum of light in the wavelength range centered on first peak wavelength $\lambda_1$ is at least 0.8 times and at most 1.2 times the full width at half maximum of light in the wavelength range centered on second peak wavelength $\lambda_2$.

Light in the range from at least 500 nm and at most 750 nm illustrated in FIG. 11A and FIG. 11B is light resulting from wavelength conversion performed by wavelength conversion layer 41 and wavelength conversion layer 51 included in the first light source and the second light source, respectively. The radiant flux of the wavelength-converted light in the first light and the radiant flux of the wavelength-converted light in the second light are the same. Through adjustment of wavelength conversion layer 41 and wavelength conversion layer 51, the radiant flux of the wavelength-converted light in the first light and the radiant flux of the wavelength-converted light in the second light become approximately the same.

In Embodiment 1, the integral of the radiant flux of the first light in the full wavelength range and the integral of the radiant flux of the second light in the full wavelength range are approximately the same, but the present variation is not limited to this.

The following shows the result of Study 1 conducted on the glare that the first light and the second light give to a subject.

Figure 12:
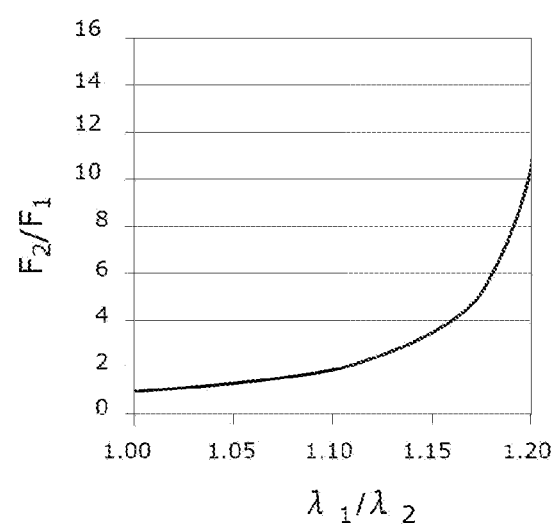
FIG. 12 is a graph illustrating the range in which a subject is likely to perceive the second light as less glaring than the first light according to Variation 1 of Embodiment 1.

FIG. 12 is a graph illustrating the range in which the subject is likely to perceive the second light as less glaring than the first light according to Variation 1 of Embodiment 1. Note that this range is indicated by a range in which the value of $F_2/F_1$ is below the curve.

This study was conducted under the conditions described hereinafter. First, the luminance in the subject's field of view was set to at most $10^{-2}$ cd/m². In other words, this study was conducted in scotopic vision. Furthermore, the glare perceived by the subject (in this case, a pedestrian) was studied by illuminating the subject with the first light or the second light while controlling first peak wavelength $\lambda_1$, first peak intensity $F_1$, second peak wavelength $\lambda_2$, and second peak intensity $F_2$.

As described above, in the range in which the value of $F_2/F_1$ is below the curve, the subject is likely to perceive the second light as less glaring than the first light. In other words, the scotopic luminance of the second light is lower than the scotopic luminance of the first light.

The relationship between first peak intensity $F_1$, first peak wavelength $\lambda_1$, second peak intensity $F_2$, and second peak wavelength $\lambda_2$ illustrated in FIG. 12 satisfies Expression (1).

$$F_2/F_1 < (20 \times \lambda_1 - 8250)/(20 \times \lambda_2 - 8250) \qquad (1)$$

With the above configuration, the subject (e.g., a pedestrian) is likely to perceive the second light as less glaring than the first light.

In the present variation, too, performing the processing in accordance with the flowchart illustrated in FIG. 9 described in Embodiment 1 leads to a decrease in the first light and an increase in the second light, thus causing an increase in the proportion of light (the second light) that is less glaring to pedestrians. Therefore, illumination device 100 which emits light that is less glaring to pedestrians is realized.

Variation 2 of Embodiment 1

According to the present variation, the first peak wavelength may be at least 450 nm and the second peak wavelength of the second light may be less than 450 nm.

The inventors have conducted verification of a light source which can be used as the first source and the second light source. The inventors verified the scotopic luminance while changing the peak wavelength of the light source, more specifically, while changing the peak wavelength of the excitation light emitted from the light source.

Figure 13:
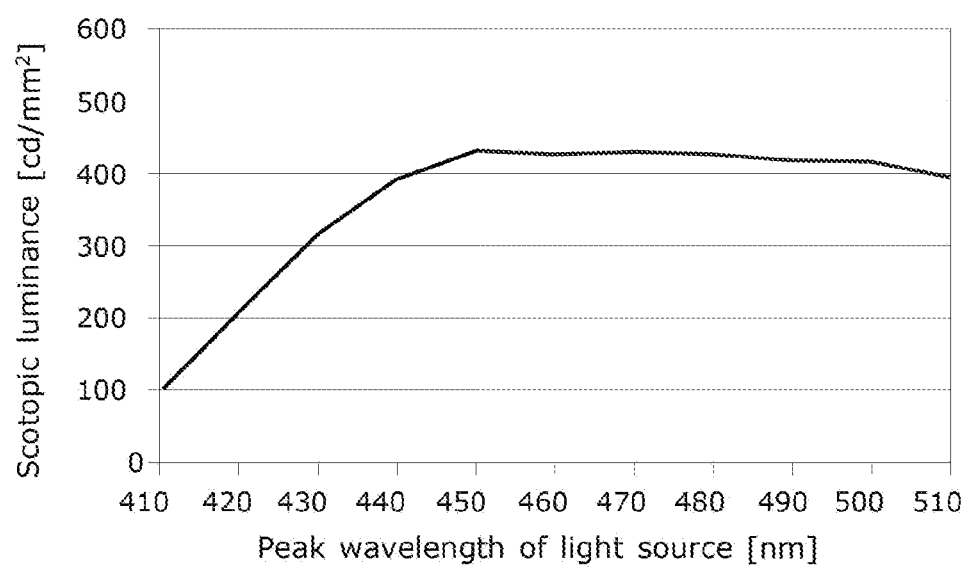
FIG. 13 is a graph illustrating the relationship between the scotopic luminance and peak wavelength of a light source which can be used as the first light source and the second light source according to Variation 2 of Embodiment 1.

FIG. 13 is a graph illustrating the relationship between the scotopic luminance and the peak wavelength of the light source which can be used as the first light source and the second light source according to Variation 2 of Embodiment 1.

Note that the integral of the luminous flux in the full wavelength range of light emitted by the light source in photopic vision is constant and does not depend on the peak wavelength of the light source. The emission color of light from the light source in photopic vision is white. The emission color white means, for example, that the color temperature is at least 4500 K and at most 6700 K. The phosphor concentration, the thickness, and the like of the wavelength conversion layer used in the light source are adjusted to make the emission color of the light source white in photopic vision.

As illustrated in FIG. 13, the scotopic luminance of light emitted by the light source has a bending point in the range in which the peak wavelength is 450 nm. In the range in which the peak wavelength is at least 450 nm, the scotopic luminance of light emitted by the light source is constant. On the other hand, in the range in which the peak wavelength is less than 450 nm, the scotopic luminance of light emitted by the light source decreases as the wavelength becomes shorter.

The above shows that when the first peak wavelength of the first light source is at least 450 nm and the second peak wavelength of the second light source is less than 450 nm, the scotopic luminance of the second light emitted by the second light source is lower than the scotopic luminance of the first light emitted by the first light source.

Therefore, pedestrians are likely to perceive the second light as less glaring than the first light.

In the present variation, too, performing the processing in accordance with the flowchart illustrated in FIG. 9 described in Embodiment 1 leads to a decrease in the first light and an increase in the second light, thus causing an increase in the proportion of light (the second light) that is less glaring to pedestrians. Therefore, illumination device 100 which emits light that is less glaring to pedestrians is realized.

Variation 3 of Embodiment 1

According to the present variation, both the first peak wavelength and the second peak wavelength may be at least 420 nm and at most 470 nm.

The inventors have conducted verification of a light source which can be used as the first source and the second light source. The inventors verified the conditions that satisfy the chromaticity required for automotive headlights defined by Japanese Industrial Standards (JIS) D 5500: 1995, while changing the peak wavelength of the light source, more specifically, while changing the peak wavelength of the excitation light of the light source.

The result was that Y value of chromaticity exceeded the upper limit of the JIS standard when the peak wavelength was less than 420 nm, and Y value of chromaticity exceeded the upper limit of the JIS standard also when the peak wavelength was greater than 470 nm.

In other words, with the above configuration, illumination device 100 can be used as automotive headlights.

Embodiment 2

Embodiment 1 has described the example in which the scotopic luminance of light emitted by lamp bodies 3 when the detection device detects an object is lower than the scotopic luminance of light emitted by lamp bodies 3 when the detection device does not detect an object. Embodiment 2 illustrates a behavior different from this example.

Note that Embodiment 2 omits detailed descriptions of constituent elements that are common to Embodiment 1.

The illumination device according to Embodiment 2 has the same configuration as illumination device 100 according to Embodiment 1. That is to say, the illumination device according to the present embodiment includes a lamp body unit, a detection device, and a control device. The lamp body unit includes a high beam unit and a low beam unit. The high beam unit includes lamp bodies. Each lamp body includes a first light source that emits first light and a second light source that emits second light.

The following shows the result of Study 2 conducted on the glare that the first light and the second light give to a subject.

Figure 14:
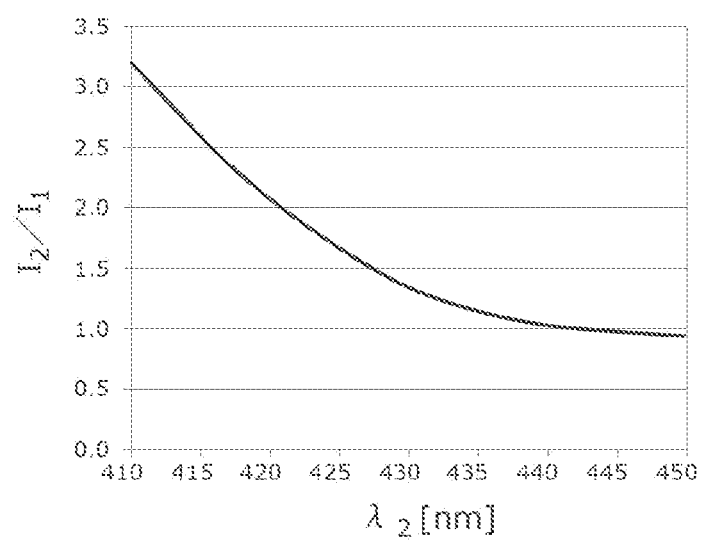
FIG. 14 is a graph illustrating the range in which a subject is likely to perceive the second light as less glaring than the first light according to Embodiment 2.

FIG. 14 is a graph illustrating the range in which the subject is likely to perceive the second light as less glaring than the first light according to Embodiment 2. Note that this range is indicated by a range in which the value of $I_2/I_1$ is below the curve.

This study was conducted under the conditions described hereinafter. First, the luminance in the subject's field of view was set to at most $10^{-2}$ cd/m². In other words, this study was conducted in scotopic vision. The visibility perceived by the subject (in this case, a pedestrian) was studied while controlling the peak wavelength and the radiant flux of the first light and the second light.

Here, assume that $\lambda_1$ and $I_1$ respectively denote a first peak wavelength and a first radiant flux of the first light emitted by the first light source. Assume also that $\lambda_2$ and $I_2$ respectively denote a second peak wavelength and a second radiant flux of the second light emitted by the second light source. First radiant flux $I_1$ is the integral of the radiant flux of the first light in the full wavelength range, and second radiant flux $I_2$ is the integral of the radiant flux of the second light in the full wavelength range. Note that first peak wavelength $\lambda_1$ and first radiant flux $I_1$ are fixed values.

Assume also that first peak wavelength $\lambda_1$ is at least 450 nm, and that the first light and the second light are white light.

First, the first light source emits the first light toward the subject. After the first light source is turned off, the second light source emits the second light toward the subject while second peak wavelength $\lambda_2$ and second radiant flux $I_2$ are controlled. Here, a study was conducted on the glare perceived by the subject when the second light is emitted, as compared to the glare perceived by the subject when the first light is emitted.

As described above, the subject is likely to perceive the second light as less glaring than the first light in the range in which the value of $I_2/I_1$ is below the curve. In other words, the scotopic luminance of the second light is lower than the scotopic luminance of the first light.

The relationship between first peak wavelength $\lambda_1$, first radiant flux $I_1$, second peak wavelength $\lambda_2$, and second radiant flux $I_2$ illustrated in FIG. 14 satisfies Expression (2).

$$I_2/I_1 < 2.00 \times 10^{-3} \times (\lambda_2 - 443)^2 + 1.00 \qquad (2)$$

With the above configuration, the subject (e.g., a pedestrian) is likely to perceive the second light as less glaring than the first light.

In the present embodiment, too, performing the processing in accordance with the flowchart illustrated in FIG. 9 described in Embodiment 1 leads to a decrease in the first light and an increase in the second light, thus causing an increase in the proportion of light (the second light) that is less glaring to pedestrians. Therefore, an illumination device which emits light that is less glaring to pedestrians is realized.

Embodiment 3

Embodiment 1 has described the example in which the scotopic luminance of light emitted by lamp bodies 3 when the detection device detects an object is lower than the scotopic luminance of light emitted by lamp bodies 3 when the detection device does not detect an object. Embodiment 3 illustrates a behavior different from this example.

Note that Embodiment 3 omits detailed descriptions of constituent elements that are common to Embodiments 1 and 2.

The illumination device according to Embodiment 3 has the same configuration as illumination device 100 according to Embodiment 1. That is to say, the illumination device according to the present embodiment includes a lamp body unit, a detection device, and a control device. The lamp body unit includes a high beam unit and a low beam unit. The high beam unit includes lamp bodies. Each lamp body includes a first light source that emits first light and a second light source that emits second light.

The following describes the result of Study 3 conducted on the relationship between light emitted by a lamp body and the visibility of a subject.

This study was conducted under the conditions described hereinafter. First, the luminance in the subject's field of view was set to at least 1 cd/m². In other words, this study was conducted in photopic vision. The visibility perceived by the subject (in this case, a driver driving an automobile including the illumination device according to the present embodiment) was studied while the luminous flux of light emitted by the lamp body was controlled.

Note that the luminous flux used in this study is the integral of the luminous flux of the light emitted by the lamp body in the full wavelength range.

Specifically, the lamp body emits light (hereinafter referred to as reference light) whose luminous flux is a reference value toward an object. Furthermore, the lamp body emits light (hereinafter referred to as low luminous flux light) whose luminous flux is lower than the luminous flux of the reference light toward the object. Here, a study was conducted on whether emission of the low luminous flux light would decrease the visibility of the subject as compared to emission of the reference light. Note that, for example, the following low luminous flux light was used: light whose luminous flux is 90% of the luminous flux of the reference light; light whose luminous flux is 70% of the luminous flux of the reference light; light whose luminous flux is 50% of the luminous flux of the reference light; light whose luminous flux is 30% of the luminous flux of the reference light; and light whose luminous flux is 10% of the luminous flux of the reference light. The above study was conducted on each type of the low luminous flux light.

As a result of this study, it became evident that, in photopic vision, low luminous flux light whose luminous flux is at least 50% of the luminous flux of the reference light is less likely to decrease the visibility of the subject. In the present embodiment, the reference light may be light emitted by the lamp body when the detection device does not detect that an object is present.

Here, in photopic vision, the luminous flux of light emitted by the lamp body when the detection device detects that an object is present may be higher than 50% of the luminous flux of light emitted by the lamp body when the detection device does not detect that an object is present. With this, an illumination device is realized which emits light that is less likely to decrease the visibility of the subject (e.g., a driver) even when the detection device detects that an object is present.

Next, a specific processing procedure of an illumination method performed by the illumination device according to the present embodiment will be described with reference to FIG. 15.

Figure 15:
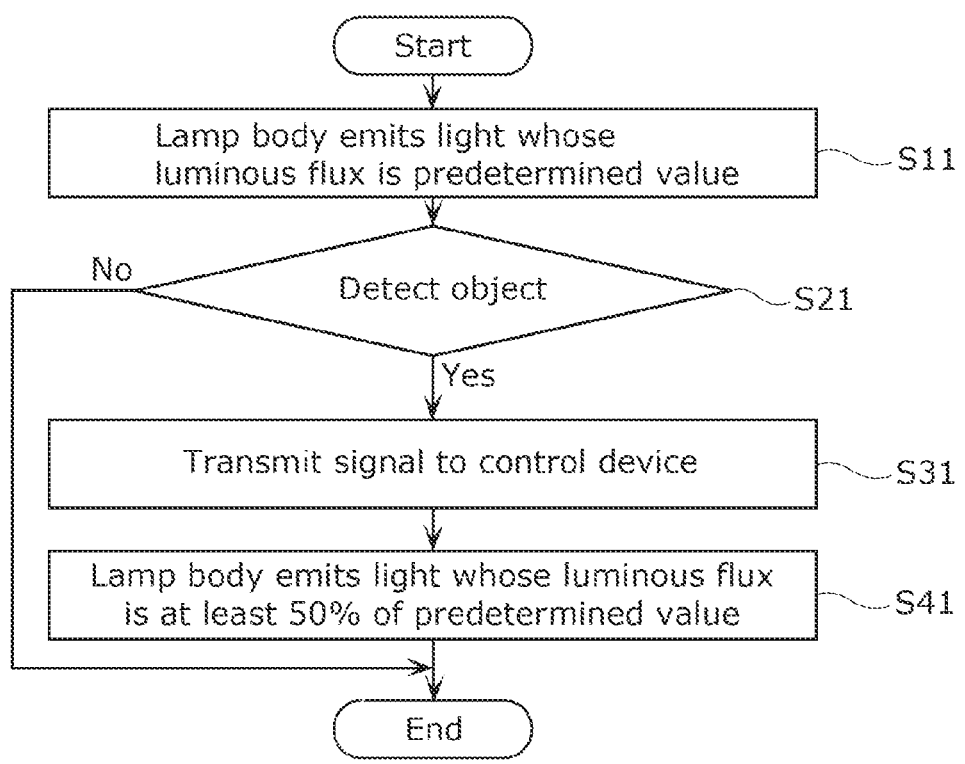
FIG. 15 is a flowchart illustrating a processing procedure of illumination performed by an illumination device according to Embodiment 3.

FIG. 15 is a flowchart illustrating a processing procedure of illumination performed by the illumination device according to the present embodiment.

First, a lamp body emits light whose luminous flux ms a predetermined value (step S11). Specifically, the control device controls the amount of power supplied to the lamp body (the first light source and the second light source), and the lamp body emits light whose luminous flux is a predetermined value. Here, the light which is emitted by the lamp body and whose luminous flux is a predetermined value may be the above-described light emitted by the lamp body when an object is not detected. More specifically, the control device may turn on the first light source by controlling the amount of power supplied to the first light source.

Furthermore, the detection device detects whether an object is present at a position illuminated by the light emitted from the lamp body (step S21).

Here, when the detection device detects that an object is present (Yes in step S21), the detection device outputs a detection result (signal) to the control device (step S31).

Furthermore, by the control device controlling the amount of power supplied to the lamp body (the first light source and the second light source) based on the detection result (signal) of the detection device, the lamp body emits light whose luminous flux is at least 50% of the predetermined value (step S41). Here, the light which is emitted by the lamp body and whose luminous flux is at least 50% of the predetermined value may be the above-described light emitted by the lamp body when an object is detected. More specifically, the control device may decrease the luminous flux of the first light and increase the luminous flux of the second light by controlling the amount of power supplied to the first light source and the second light source.

The processing is finished after the lamp body emits light whose luminous flux is at least 50% of the predetermined value in step S41 as described above. The processing is finished also when the detection device does not detect that an object is present (No in step S21).

Figure 16:
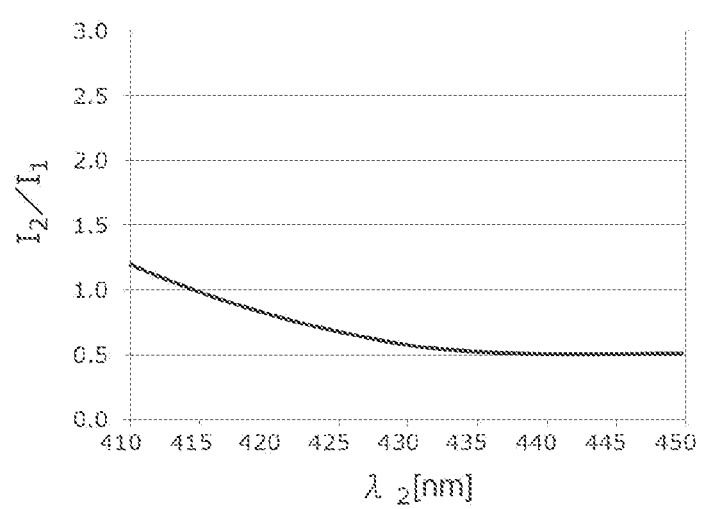
FIG. 16 is a graph illustrating the range in which the visibility of a subject is less likely to decrease according to Embodiment 3.

In addition, Study 4 was conducted on the subject of Study 3. In Study 4, the relationship between the first and second light and the visibility of the subject was studied. FIG. 16 illustrates the result of this study.

FIG. 16 is a graph illustrating the range in which the visibility of the subject is less likely to decrease according to Embodiment 3. Note that this range is indicated by a range in which the value of $I_2/I_1$ is above the curve.

This study was conducted under the conditions described hereinafter. First, the luminance in the subject's field of view was set to at least 1 cd/m². In other words, this study was conducted in photopic vision. The visibility perceived by the subject (in this case, a driver) was studied while controlling the peak wavelength and the radiant flux of the first light and the second light.

Here, assume that $\lambda_1$ and $I_1$ respectively denote a first peak wavelength and a first radiant flux of the first light emitted by the first light source. Assume also that $\lambda_2$ and $I_2$ respectively denote a second peak wavelength and a second radiant flux of the second light emitted by the second light source. First radiant flux $I_1$ is the integral of the radiant flux of the first light in the full wavelength range, and second radiant flux $I_2$ is the integral of the radiant flux of the second light in the full wavelength range. Note that first peak wavelength $\lambda_1$ and first radiant flux $I_1$ are fixed values.

Assume also that first peak wavelength $\lambda_1$ is at least 450 nm, and that the first light and the second light are white light.

First, the first light source emits the first light toward an object. After the first light source is turned off, the second light source emits the second light toward the object while second peak wavelength $\lambda_2$ and second radiant flux $I_2$ are controlled. Here, a study was conducted on whether emission of the second light would decrease the visibility of the subject as compared to emission of the first light.

As described above, the visibility of the subject is less likely to decrease in the range in which the value of $I_2/I_1$ is above the curve.

The relationship between first radiant flux $I_1$, second peak wavelength $\lambda_2$, and second radiant flux $I_2$ illustrated in FIG. 16 satisfies Expression (3).

$$I_2/I_1 > 7.84 \times 10^{-4} \times (\lambda_2 - 439)^2 + 5.05 \times 10^{-1} \qquad (3)$$

With the above configuration, the visibility of the subject (e.g., a driver driving the automobile including the illumination device according to the present embodiment) is less likely to decrease.

Furthermore, in the present embodiment, the visibility of the driver is less likely to decrease even when the first light is decreased and the second light is increased as a result of the processing performed in accordance with the flowchart in FIG. 9 described in Embodiment 1. Therefore, an illumination device which emits light that is less likely to decrease the visibility of the subject (e.g., the driver) is realized.

Note that the value of $I_2/I_1$ may satisfy Expression (3) and Expression (2) at the same time. This makes it possible to realize an illumination device which emits light that is less likely to decrease the visibility of the driver and is less glaring to pedestrians.

Embodiment 4

Embodiment 4 describes a light-emitting module applicable to Embodiments 1, 2, and 3.

Note that Embodiment 4 omits detailed descriptions of constituent elements that are common to Embodiments 1, 2, and 3.

A configuration of light-emitting module 1000 according to Embodiment 4 will be described with reference to the drawings.

Figure 17:
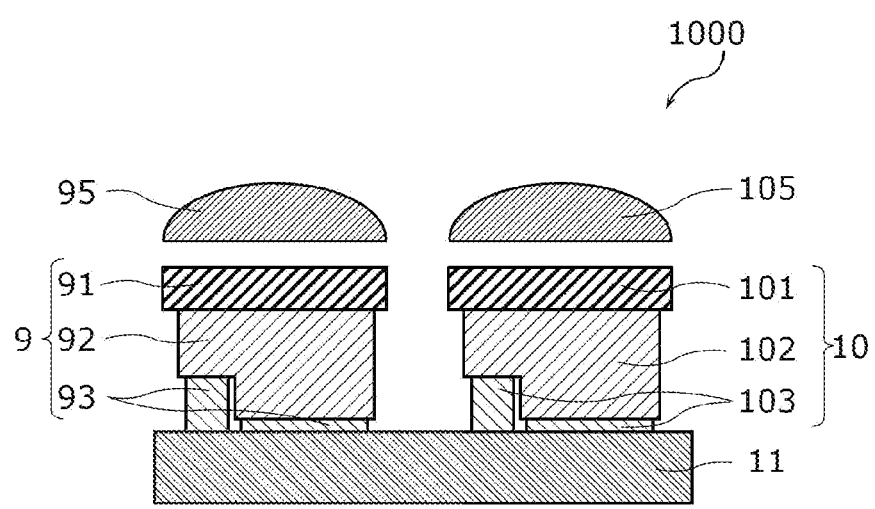
FIG. 17 is a cross-sectional view illustrating a light-emitting module according to Embodiment 4.

FIG. 17 is a cross-sectional view illustrating light-emitting module 1000 according to the present embodiment. Light-emitting module 1000 is a component included in each lamp body 3 according to Embodiments 1 and 2, for example. FIG. 17 is a cross-sectional view corresponding to FIG. 3A and FIG. 33, for example.

Light-emitting module 1000 according to the present embodiment includes first white light source 9, second white light source 10, substrate 11, and a structure body. Light-emitting module 1000 may include optical components 95 and 105.

Substrate 11 is a substrate on which first white light source 9 and second white light source 10 are mounted, and includes metal wiring for supplying power to first white light source 9 and second white light source 10.

First white light source 9 includes bumps 93, first excitation source 92, and first wavelength conversion component 91.

Bumps 93 are connected to first excitation source 92 and the metal wiring included in substrate 11, and allows supply of power to first excitation source 92 from the metal wiring.

First excitation source 92 is a light-emitting body that emits light having a first peak wavelength in the wavelength range from near-ultraviolet to green in the emission spectrum. First excitation source 92 is, for example, a light-emitting body such as an LED. First excitation source 92 is an LED that emits light in the wavelength range from near-ultraviolet to green. Note that, other than an LED, a laser diode can also be used as the first excitation source.

First wavelength conversion component 91 is a component that converts the light emitted from first excitation source 92.

More specifically, first wavelength conversion component 91 is a component that converts the light emitted from first excitation source 92 into light of a different wavelength. First wavelength conversion component 91 may also be a sealing layer that seals first excitation source 92. First wavelength conversion component 91 is formed using, for example, a light-transmissive resin material, glass, or ceramics containing yellow phosphor particles as a wavelength conversion material. For example, a silicone resin is used as the light-transmissive resin material, but an epoxy resin, a urea resin, or the like may be used. For example, yttrium aluminum garnet (YAG) phosphor particles are used as the yellow phosphor particles.

Optical component 95 is a component that guides or condenses the light emitted from first white light source 9. Optical component 95 is, for example, a convex lens that condenses the light. Optical component 95 is disposed opposite first wavelength conversion component 91. Providing optical component 95 allows the light from first white light source 9 to be emitted toward a given position.

Second white light source 10 includes bumps 103, second excitation source 102, and second wavelength conversion component 101.

Bumps 103 are connected to second excitation source 102 and the metal wiring included in substrate 11, and allows supply of power to second excitation source 102 from the metal wiring.

Second excitation source 102 is a light-emitting body that emits light having a second peak wavelength in the wavelength range from near-ultraviolet to green in the emission spectrum. Second excitation source 102 is, for example, a light-emitting body such as an LED. Second excitation source 102 is an LED that emits light in the wavelength range from near-ultraviolet to green. Note that, other than an LED, a laser diode can also be used as the second excitation source.

Second wavelength conversion component 101 is a component that converts the light emitted from second excitation source 102.

More specifically, second wavelength conversion component 101 may be formed using the same component as that of first wavelength conversion component 91.

Optical component 105 is a component that guides or condenses the light emitted from second white light source 10. Optical component 105 is, for example, a convex lens that condenses the light. Optical component 105 is disposed opposite second wavelength conversion component 101. Providing optical component 105 allows the light from second white light source 10 to be emitted toward a given position.

From the foregoing, first white light source 9, second white light source 10, and substrate 11 correspond to first light source 4 and second light source 5 according to Embodiments 1, 2, and 3. Also, optical components 95 and 105 correspond to first optical component 45 and second optical component 55 according to Embodiments 1, 2, and 3.

The structure body is a component for independently controlling the ON state of each of first white light source 9 and second white light source 10.

For example, the structure body may be metal wiring provided to substrate 11. In the present embodiment, four pieces of metal wiring may be provided, and the four pieces of metal wiring may be connected to the anodes and cathodes of first white light source 9 and second white light source 10. With this, the ON state of each of first white light source 9 and second white light source 10 is independently controlled.

Note that three pieces of metal wiring may be provided, and one piece of wiring may be connected to electrodes of first white light source 9 and second white light source 10.

With the above configuration, light emitted by second white light source 10 has a scotopic luminance lower than the scotopic luminance of light emitted by first white light source 9, as described in Embodiment 1, for example. Thus, light emitted by second white light source 10 is light that is less glaring to pedestrians.

Furthermore, when the processing is performed in accordance with the flowchart in FIG. 9, the light emitted by first white light source 9 decreases and the light emitted by second white light source 10 increases. In other words, the proportion of light that is less glaring to pedestrians increases. Therefore, light-emitting module 1000 which emits light that is less glaring to pedestrians is realized.

Other Embodiments

Although the illumination device and the light-emitting module according to the present disclosure have been described above based on embodiments and variations, the present disclosure is not limited to these embodiments and variations. Forms achieved by making various modifications to the embodiments that are conceivable by a person of skill in the art as well as other forms resulting from combinations of some of the constituent elements from the embodiments and variations are within the scope of the present disclosure, so long as such forms are within the essence of the present disclosure.

For example, in FIG. 1, one lamp body 3 among the plurality of lamp bodies 3 includes one first light source 4 and one second light source 5, but the present disclosure is not limited to this. One lamp body 3 among the plurality of lamp bodies 3 may include a plurality of first light sources 4 and a plurality of second light sources 5.

In addition, in FIG. 1, first light source 4 is disposed below second light source 5, but the present disclosure is not limited to this. For example, first light source 4 may be disposed above second light source 5, or, first light source 4 and second light source 5 may be disposed side by side horizontally.

As illustrated in FIG. 3A and FIG. 3B, in Embodiment 1, two optical components (i.e., first optical component 45 and second optical component 55) are provided, but the present disclosure is not limited to this. For example, one optical component may be provided in the direction in which first light source 4 and second light source 5 emit light. The one optical component may be a lens, for example. Note that, in Embodiment 4, too, one optical component may be provided in the direction in which first white light source 9 and second white light source 10 emit light.

In Embodiment 1, light emission by first light source 4 and second light source 5 is controlled by control device 2 controlling the amount of power supplied to first light source 4 and second light source 5, but the present disclosure is not limited to this. Control device 2 may use any method so long as light emission by first light source 4 and second light source 5 can be controlled.

Each of the above embodiments has described an illumination device and the like that emit light that is less glaring to pedestrians, but the present disclosure is not limited to this. For example, as described above, the object includes a bicyclist. Thus, the illumination device and the like described in each of the above embodiments emit light that is less glaring to bicyclists, too.

In each of the above embodiments, the illumination device is used as automotive headlights, but the present disclosure is not limited to this. For example, the illumination device can be used as a street light or stadium lighting.

In the case of using the illumination device as a street light, an object detected by the detection device may be a person located on a road and sidewalk, as in each of the above embodiments. In this case, too, the illumination device and the like emit light that is less glaring to pedestrians, for example.

In the case of using the illumination device as stadium lighting, an object detected by the detection device may be a person in the stadium, for example an athlete, referee, or spectator of a game played in the stadium. In this case, too, the illumination device and the like emit light that is less glaring to the athlete, for example. This allows the athlete to play a game in a condition in which the athlete is less likely to perceive the stadium lighting as glaring.

Furthermore, first optical component 45, second optical component 55, optical component 95, and optical component 105 may be uniconvex lenses or biconvex lenses, and are not limited to lenses of the same configuration.

Note that these general or specific aspects may be implemented by a system, a method, an integrated circuit, a computer program, or a computer-readable recording medium such as a compact disc read only memory (CD-ROM), or by any combination of systems, methods, integrated circuits, computer programs, or recording media.

Although the illumination device according to one or more aspects has been described above based on exemplary embodiments, the present disclosure is not limited to these embodiments. Forms achieved by making various modifications to the embodiments that are conceivable by a person of skill in the art as well as other forms resulting from combinations of constituent elements from different embodiments may be within the scope of one or more aspects, so long as such forms are within the essence of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The illumination device and the like according to the present disclosure can be used as light-emitting devices for various applications such as automotive headlights, stadium lighting, and street lights.

The invention claimed is:
1. An illumination device comprising:
 a first light source that emits first light having a first peak wavelength which is highest in intensity in a wavelength range from near-ultraviolet to green in an emission spectrum;
 a second light source that emits second light having a second peak wavelength which is highest in intensity in a wavelength range from near-ultraviolet to green in an emission spectrum, the second light illuminating a position identical to a position illuminated by the first light;
 a detection device that detects whether an object is present at a given position;
 a first optical component that includes a first lens and guides or condenses the first light; and
 a second optical component that includes a second lens and guides or condenses the second light, wherein:
 the second peak wavelength is shorter than the first peak wavelength, and a luminous flux of the first light is decreased and a luminous flux of the second light is increased when the detection device detects that the object is present at the given position.

2. The illumination device according to claim 1, further comprising:
a lamp body including the first light source, the first optical component, the second light source, and the second optical component, wherein
a scotopic luminance of light emitted by the lamp body when the detection device detects that the object is present is lower than a scotopic luminance of light emitted by the lamp body when the detection device does not detect that the object is present.

3. The illumination device according to claim 1, wherein
the first peak wavelength is at least 450 nm, and
the second peak wavelength is less than 450 nm.

4. The illumination device according to claim 1, wherein $$I_2/I_1 < 2.00 \times 10^{-3} \times (\lambda_2 - 443)^2 + 1.00$$

is satisfied where $I_1$ denotes a radiant flux of the first light, $I_2$ denotes a radiant flux of the second light, and $\lambda_2$ denotes the second peak wavelength.

5. The illumination device according to claim 1, wherein when the detection device detects that the object is present,
the first light source changes from an ON state to an OFF state, and
the second light source changes from an OFF state to an ON state.

6. The illumination device according to claim 1, further comprising:
a lamp body including the first light source, the first optical component, the second light source, and the second optical component, wherein
a luminous flux of light emitted by the lamp body when the detection device detects that the object is present is higher than 50% of a luminous flux of light emitted by the lamp body when the detection device does not detect that the object is present.

7. The illumination device according to claim 1, wherein $$I_2/I_1 > 7.84 \times 10^{-4} \times (\lambda_2 - 439)^2 + 5.05 \times 10^{-1}$$

is satisfied where $I_1$ denotes a radiant flux of the first light, $I_2$ denotes a radiant flux of the second light, and $\lambda_2$ denotes the second peak wavelength.

8. An illumination device comprising:
a first light source that emits first light having a first peak wavelength which is highest in intensity in a wavelength range from near-ultraviolet to green in an emission spectrum;
a second light source that emits second light having a second peak wavelength which is highest in intensity in a wavelength range from near-ultraviolet to green in an emission spectrum, the second light illuminating a position identical to a position illuminated by the first light; and
a detection device that detects whether an object is present at a given position, wherein
the second peak wavelength is shorter than the first peak wavelength, and
a luminous flux of the first light is decreased and a luminous flux of the second light is increased when the detection device detects that the object is present at the given position, wherein:
both the first peak wavelength and the second peak wavelength are at least 413 nm and at most 505 nm, and $$F_2/F_1 < (20 \times \lambda_1 - 8250)/(20 \times \lambda_2 - 8250)$$

is satisfied where $F_1$ denotes a peak intensity of the first peak wavelength, $\lambda_1$ denotes the first peak wavelength, $F_2$ denotes a peak intensity of the second peak wavelength, and $\lambda_2$ denotes the second peak wavelength.

9. The illumination device according to claim 8, further comprising:
a lamp body including the first light source, a first optical component that guides or condenses the first light, the second light source, and a second optical component that guides or condenses the second light, wherein
a scotopic luminance of light emitted by the lamp body when the detection device detects that the object is present is lower than a scotopic luminance of light emitted by the lamp body when the detection device does not detect that the object is present.

10. The illumination device according to claim 8, wherein
the first peak wavelength is at least 450 nm, and
the second peak wavelength is less than 450 nm.

11. The illumination device according to claim 8, wherein $$I_2/I_1 < 2.00 \times 10^{-3} \times (\lambda_2 - 443)^2 + 1.00$$

is satisfied where $I_1$ denotes a radiant flux of the first light, $I_2$ denotes a radiant flux of the second light, and $\lambda_2$ denotes the second peak wavelength.

12. The illumination device according to claim 8, wherein when the detection device detects that the object is present,
the first light source changes from an ON state to an OFF state, and
the second light source changes from an OFF state to an ON state.

13. The illumination device according to claim 8, further comprising:
a lamp body including the first light source, a first optical component that guides or condenses the first light, the second light source, and a second optical component that guides or condenses the second light, wherein
a luminous flux of light emitted by the lamp body when the detection device detects that the object is present is higher than 50% of a luminous flux of light emitted by the lamp body when the detection device does not detect that the object is present.

14. The illumination device according to claim 8, wherein $$I_2/I_1 > 7.84 \times 10^{-4} \times (\lambda_2 - 439)^2 + 5.05 \times 10^{-1}$$

is satisfied where $I_1$ denotes a radiant flux of the first light, $I_2$ denotes a radiant flux of the second light, and $\lambda_2$ denotes the second peak wavelength.

15. An illumination device comprising:
a first light source that emits first light having a first peak wavelength which is highest in intensity in a wavelength range from near-ultraviolet to green in an emission spectrum;
a second light source that emits second light having a second peak wavelength which is highest in intensity in a wavelength range from near-ultraviolet to green in an emission spectrum, the second light illuminating a position identical to a position illuminated by the first light; and
a detection device that detects whether an object is present at a given position, wherein
the second peak wavelength is shorter than the first peak wavelength, and a luminous flux of the first light is decreased and a luminous flux of the second light is increased when the detection device detects that the object is present at the given position, wherein both the first peak wavelength and the second peak wavelength are at least 420 nm and at most 470 nm.

16. The illumination device according to claim 15, further comprising:

a lamp body including the first light source, a first optical component that guides or condenses the first light, the second light source, and a second optical component that guides or condenses the second light, wherein a scotopic luminance of light emitted by the lamp body when the detection device detects that the object is present is lower than a scotopic luminance of light emitted by the lamp body when the detection device does not detect that the object is present.

17. The illumination device according to claim 15, wherein the first peak wavelength is at least 450 nm, and the second peak wavelength is less than 450 nm.

18. The illumination device according to claim 15, wherein $$I_2/I_1 < 2.00 \times 10^{-3} \times (\lambda_2 - 443)^2 + 1.00$$

is satisfied where $I_1$ denotes a radiant flux of the first light, $I_2$ denotes a radiant flux of the second light, and $\lambda_2$ denotes the second peak wavelength.

19. The illumination device according to claim 15, wherein when the detection device detects that the object is present, the first light source changes from an ON state to an OFF state, and the second light source changes from an OFF state to an ON state.

20. The illumination device according to claim 15, further comprising:

a lamp body including the first light source, a first optical component that guides or condenses the first light, the second light source, and a second optical component that guides or condenses the second light, wherein a luminous flux of light emitted by the lamp body when the detection device detects that the object is present is higher than 50% of a luminous flux of light emitted by the lamp body when the detection device does not detect that the object is present.

21. The illumination device according to claim 15, wherein $$I_2/I_1 > 7.84 \times 10^{-4} \times (\lambda_2 - 439)^2 + 5.05 \times 10^{-1}$$

is satisfied where $I_1$ denotes a radiant flux of the first light, $I_2$ denotes a radiant flux of the second light, and $\lambda_2$ denotes the second peak wavelength.

* * * * *